United States Patent
Lee et al.

(10) Patent No.: US 10,714,559 B2
(45) Date of Patent: Jul. 14, 2020

(54) ORGANIC LIGHT EMITTING DIODE, METHOD OF MANUFACTURING THE SAME, AND ORGANIC LIGHT EMITTING DISPLAY INCLUDING THE SAME

(71) Applicant: Samsung Display Co., Ltd., Yongin-si, Gyeonggi-do (KR)

(72) Inventors: Joon Gu Lee, Seoul (KR); Yeon Hwa Lee, Hwaseong-si (KR); Se Hoon Jeong, Suwon-si (KR); Ji Young Choung, Hwaseong-si (KR); Man Ho Kim, Asan-si (KR); Jae Ik Kim, Seoul (KR); Jin Baek Choi, Anyang-si (KR)

(73) Assignee: Samsung Display Co., Ltd. (KR)

( * ) Notice: Subject to any disclaimer, the term of this patent is extended or adjusted under 35 U.S.C. 154(b) by 12 days.

(21) Appl. No.: 15/405,132

(22) Filed: Jan. 12, 2017

(65) Prior Publication Data

US 2017/0207290 A1 Jul. 20, 2017

(30) Foreign Application Priority Data

Jan. 15, 2016 (KR) .................... 10-2016-0005287

(51) Int. Cl.
*H01L 27/32* (2006.01)
*H01L 51/52* (2006.01)
(Continued)

(52) U.S. Cl.
CPC ...... *H01L 27/3276* (2013.01); *H01L 27/3262* (2013.01); *H01L 51/0021* (2013.01);
(Continued)

(58) Field of Classification Search
CPC . H01L 51/0021; H01L 51/5218; H01L 51/56; H01L 51/5256; H01L 51/5265;
(Continued)

(56) References Cited

U.S. PATENT DOCUMENTS 6,917,159 B2 7/2005 Tyan et al.
2010/0207149 A1* 8/2010 Kim .................... H01L 51/5271
257/98

(Continued)

FOREIGN PATENT DOCUMENTS

KR 10-2004-0066721 A 7/2004
KR 10-2006-0051976 A 5/2006
(Continued)

OTHER PUBLICATIONS https://www.sciencedirect.com/science/article/pii/S1566119912002054 (Sung-Min Lee, "Low resistive transparent and flexible ZnO/Ag/ZnO/Ag/WO3 electrode for organic light-emitting diode").*

(Continued)

*Primary Examiner* — Kenneth Parker
*Assistant Examiner* — Long H Le
(74) *Attorney, Agent, or Firm* — Innovation Counsel LLP

(57) ABSTRACT

According to an exemplary embodiment of the present disclosure, an organic light emitting element includes: a first electrode; a second electrode overlapping the first electrode; and an emission layer disposed between the first electrode and the second electrode, wherein at least one of the first electrode and the second electrode includes a metal layer including a first material, an oxidation layer including a second material and disposed on two opposing surfaces of the metal layer, and a barrier layer disposed at a surface of the oxidation layer, and the second material has a smaller Gibbs free energy than that of the first material.

19 Claims, 12 Drawing Sheets

(51) Int. Cl.
 *H01L 51/00* (2006.01)
 *H01L 51/56* (2006.01)
(52) U.S. Cl.
 CPC .......... *H01L 51/5218* (2013.01); *H01L 51/56* (2013.01); *H01L 27/3244* (2013.01); *H01L 51/5256* (2013.01); *H01L 51/5265* (2013.01); *H01L 2227/323* (2013.01)
(58) Field of Classification Search
 CPC ............. H01L 27/3276; H01L 27/3262; H01L 27/3244
 See application file for complete search history.

(56) References Cited

U.S. PATENT DOCUMENTS

| | | | | |
|---|---|---|---|---|
| 2011/0175513 | A1* | 7/2011 | Jeong | H01L 51/5281 313/113 |
| 2014/0048780 | A1* | 2/2014 | Song | H01L 51/5253 257/40 |
| 2014/0138639 | A1* | 5/2014 | Kim | H01L 51/5218 257/40 |
| 2014/0353599 | A1* | 12/2014 | Kang | H01L 27/3262 257/40 |

FOREIGN PATENT DOCUMENTS

| | | |
|---|---|---|
| KR | 10-2007-0023251 A | 2/2007 |
| KR | 10-0728910 B1 | 6/2007 |
| KR | 10-2014-0062598 A | 5/2014 |

OTHER PUBLICATIONS http://www.drjez.com/uco/ChemTools/Standard%20Thermodynamic%20Values.pdf (Dean, John A. "Lange's Handbook of Chemistry, 12th ed.; McGraw-Hill: New York, New York, 1979; p. 9-4-9-94").*
Lange's Handbook of Chemistry.*

* cited by examiner

ORGANIC LIGHT EMITTING DIODE, METHOD OF MANUFACTURING THE SAME, AND ORGANIC LIGHT EMITTING DISPLAY INCLUDING THE SAME

CROSS-REFERENCE TO RELATED APPLICATION

This application claims priority to, and the benefit of, Korean Patent Application No. 10-2016-0005287 filed in the Korean Intellectual Property Office on Jan. 15, 2016, the entire contents of which are incorporated herein by reference.

BACKGROUND

(a) Field

The present disclosure relates generally to flat panel displays. More specifically, the present disclosure relates to an organic light emitting element, a method of its manufacture, and an organic light emitting diode display including the same.

(b) Description of the Related Art

Recent trends toward lightweight and thin personal computers and television sets have increased the requirements for lightweight and thin display devices, and flat panel displays such as a liquid crystal display (LCD) satisfying such requirements have thus been substituted for conventional cathode ray tubes (CRTs). However, because the LCD is a passive display device, an additional backlight as a light source is needed. Furthermore, the LCD has various other problems such as slow response time and narrow viewing angle.

As a display device capable of overcoming the aforementioned limitations, an organic light emitting diode display, which is a self-emitting display element having advantages of wide viewing angle, excellent contrast, and fast response time, has attracted recent attention.

The organic light emitting diode display includes an organic light emitting element for light emission. The organic light emitting element forms excitons from the combination of electrons injected from one electrode and holes injected from another electrode, and the excitons emit energy such that light is emitted.

In general, an organic light emitting element of an organic light emitting diode display includes a metal material, however in some cases the organic light emitting element can shed metal particles, and a defective pixel may be generated in the display device due to these particles.

The above information disclosed in this Background section is only for enhancement of understanding of the background of the invention, and therefore it may contain information that does not form the prior art that is already known in this country to a person of ordinary skill in the art.

SUMMARY

The present disclosure provides an organic light emitting element preventing the defective pixel generation by preventing generation of metal particles, a manufacturing method therefor, and an organic light emitting diode display including the same.

According to an exemplary embodiment of the present disclosure, an organic light emitting element includes: a first electrode; a second electrode overlapping the first electrode; and an emission layer disposed between the first electrode and the second electrode. At least one of the first electrode and the second electrode includes a metal layer including a first material, an oxidation layer including a second material and disposed on two opposing surfaces of the metal layer, and a barrier layer disposed at a surface of the oxidation layer. The second material has a smaller Gibbs free energy than that of the first material.

The first material may include at least one of silver (Ag) and a silver alloy, gold (Au) and a gold alloy, aluminum (Al) and an aluminum alloy, nickel (Ni) and a nickel alloy, copper (Cu) and a copper alloy, tungsten (W) and a tungsten alloy, and platinum (Pt) and a platinum alloy.

The second material may include an oxide of at least one of bismuth (Bi), indium (In), palladium (Pd), tin (Sn), zinc (Zn), and titanium (Ti).

The oxide may further include at least one of bismuth oxide ($Bi_2O_3$), palladium oxide (PdO), tin oxide ($SnO_2$), zinc oxide (ZnO), indium oxide ($In_2O_3$), and titanium oxide ($TiO_2$).

The barrier layer may include a transparent conductive oxide.

The transparent conductive oxide may include at least one of indium tin oxide (ITO), indium zinc oxide (IZO), tin oxide ($SnO_2$), and zinc oxide (ZnO).

The metal layer may further include the second material.

The second electrode may include a transflective conductive material, and may include at least one of magnesium (Mg), potassium (Ca), aluminum (Al), silver (Ag), and an alloy thereof.

According to another exemplary embodiment of the present disclosure, a method of manufacturing an organic light emitting element includes: forming a barrier layer on at least one surface of a metal layer that includes a first material and a second material; heat-treating the barrier layer and the metal layer to form an oxidation layer on two opposing surfaces of the metal layer, thereby forming a first electrode; forming an emission layer on the first electrode; and forming a second electrode on the emission layer. The oxidation layer includes an oxide of the second material, and the second material has a smaller Gibbs free energy than that of the first material.

The second material may be included in a range of 0.1-3.0 wt % with respect to a total weight of the metal layer.

The heat-treating further comprises heat-treating the barrier layer and the metal layer at 150-350° C.

According to another exemplary embodiment of the present disclosure, an organic light emitting diode display includes: a substrate; a thin film transistor disposed on the substrate; a first electrode connected to the thin film transistor; a second electrode overlapping the first electrode; and an emission layer disposed between the first electrode and the second electrode. The first electrode includes a metal layer including a first material, an oxidation layer including a second material and disposed on two opposing surfaces of the metal layer, and a barrier layer disposed at the surface of the oxidation layer. The second material has a smaller Gibbs free energy than that of the first material.

As described above, according to an exemplary embodiment of the present disclosure, defective pixel generation due to electrode formation failure may be prevented through an oxidation layer automatically formed in the electrode surface during fabrication.

DETAILED DESCRIPTION OF THE EMBODIMENTS

Figure 1:
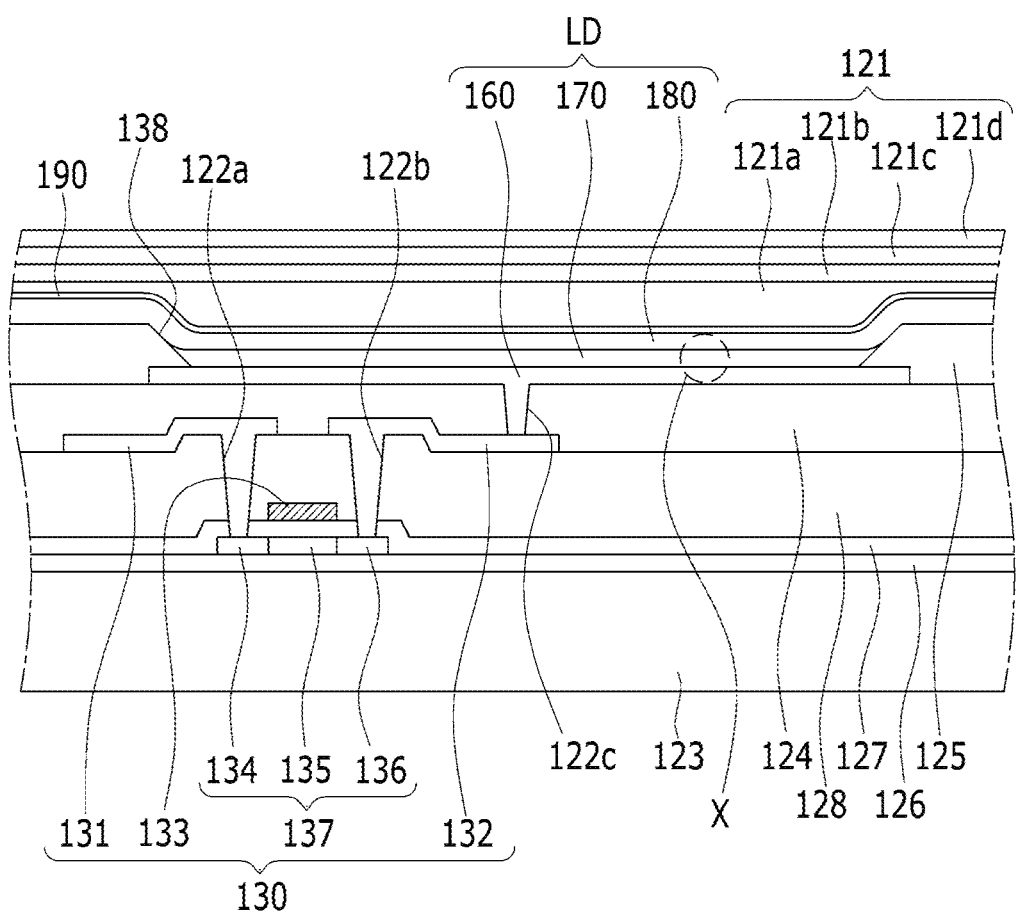
FIG. 1 is a cross-sectional view of an organic light emitting diode display according to an exemplary embodiment of the present disclosure.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thickness of layers, films, panels, regions, etc., are exaggerated for clarity. The various figures thus may not be to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

All numerical values are approximate, and may vary. All examples of specific materials and compositions are to be taken as nonlimiting and exemplary only. Other suitable materials and compositions may be used instead.

Now, an organic light emitting diode display according to an exemplary embodiment of the present disclosure will be described in detail with reference to accompanying drawings. Here, a structure of the organic light emitting diode display includes a structure for a driving thin film transistor and an emission layer.

First, the organic light emitting diode display according to an exemplary embodiment of the present disclosure will be described with reference to FIG. 1 and FIG. 2.

Figure 2:
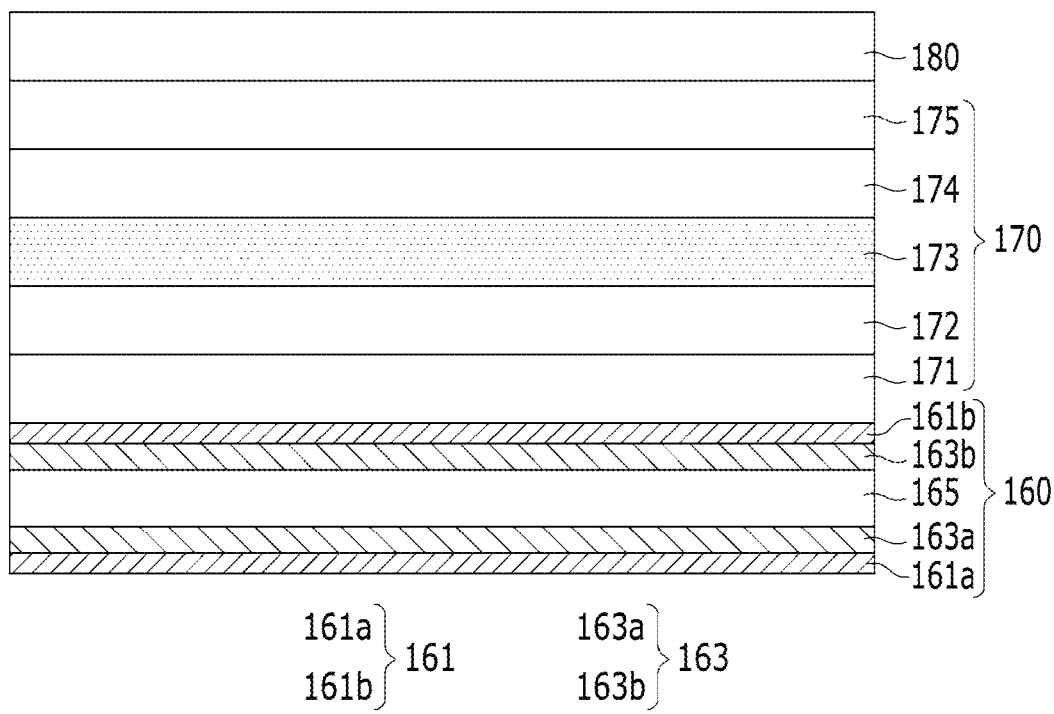
FIG. 2 is an enlarged cross-sectional view of an organic light emitting element shown in FIG. 1.

FIG. 1 is a cross-sectional view of an organic light emitting diode display according to an exemplary embodiment of the present disclosure, and FIG. 2 is an enlarged cross-sectional view of an organic light emitting element shown in FIG. 1.

Referring to FIG. 1 and FIG. 2, an organic light emitting diode display according to an exemplary embodiment of the present disclosure includes a substrate 123, a thin film transistor 130, a first electrode 160, a hole transporting region (171 and 172), an emission layer 173, an electron transporting region (174 and 175), and a second electrode 180.

The hole transporting region 171 and 172 may include a hole injection layer 171 and a hole transporting layer 172 disposed on the hole injection layer 171, and the electron transporting region 174 and 175 may include an electron transporting layer 174 and an electron injection layer 175 disposed on the electron transporting layer 174.

The first electrode 160 may be a pixel electrode. The first electrode 160 may be an anode electrode and the second electrode 180 may be a cathode electrode, or the first electrode 160 may be the cathode and the second electrode 180 may be the anode.

In this case, the substrate 123 may be made of glass, polycarbonate, poly(methyl methacrylate), polyethylene terephthalate, polyethylene naphthalate, polyamide, polyether sulfone, polyimide, or a silicon wafer.

A substrate buffer layer 126 is formed on the substrate 123. The substrate buffer layer 126 prevents penetration of impure elements and serves to flatten the surface.

A driving semiconductor layer 137 is formed on the substrate buffer layer 126. The driving semiconductor layer 137 may be formed of a polysilicon layer, or another semiconductive material. Further, the driving semiconductor layer 137 includes a channel region 135 in which impurities are not doped, and a source region 134 and a drain region 136 in which impurities are doped at respective sides of the channel region 135. In this case, the doped ion materials are P-type impurities such as boron (B), and B2H6 may be used. Here, the impurities vary according to a kind of thin film transistor.

A gate insulating layer 127 made of a silicon nitride (SiNx) or a silicon oxide (SiOx) is formed on the driving semiconductor layer 137. A gate wire including a driving gate electrode 133 is formed on the gate insulating layer 127. The driving gate electrode 133 is formed to overlap at least a part of the driving semiconductor layer 137, particularly the channel region 135.

An interlayer insulating layer 128, covering the driving gate electrode 133, is formed on the gate insulating layer 127. The gate insulating layer 127 and the interlayer insulating layer 128 have a first contact hole 122a and a second contact hole 122b exposing the source region 134 and the drain region 136 of the driving semiconductor layer 137. The interlayer insulating layer 128 may be formed by using a ceramic-based material such as a silicon nitride (SiNx) or a silicon oxide (SiOx), like the gate insulating layer 127.

A data wire, including a driving source electrode 131 and a driving drain electrode 132, is formed on the interlayer insulating layer 128. The driving source electrode 131 and the driving drain electrode 132 are connected with the source region 134 and the drain region 136 of the driving semiconductor layer 137 through the first contact hole 122a and the second contact hole 122b formed in the interlayer insulating layer 128 and the gate insulating layer 127.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the aforementioned example, and may be variously modified as a known configuration which may be readily implemented by those skilled in the art. Also, although not shown, the driving thin film transistor 130 may be connected to a switching thin film transistor. A current controlled by the switching thin film transistor, that is thereby turned on/off depending on a signal application, may be applied to an organic light emitting element LD from the driving thin film transistor 130.

In addition, a planarization layer 124 covering the data wire is formed on the interlayer insulating layer 128. The planarization layer 124 serves to remove and planarize the area underlying the organic light emitting element to be formed thereon. Further, the planarization layer 124 has a third contact hole 122c exposing a part of the drain electrode 132.

In this case, an organic light emitting element LD is disposed on the planarization layer 124. The organic light emitting element LD includes the first electrode 160, a light-emitting diode display layer 170, and the second electrode 180.

The first electrode 160 disposed on the planarization layer 124 may be respectively disposed for each of a plurality of pixels in the organic light emitting diode display according to the present exemplary embodiment. In this case, the plurality of first electrodes 160 may be disposed to be separated from each other. The first electrode 160 is connected to the drain electrode 132 through the third contact hole 122c formed in the planarization layer 124.

The first electrode 160 according to the present exemplary embodiment may be a reflecting electrode, and may be formed as a multi-layer structure including a metal layer 165, an oxidation layer 163, and a barrier layer 161. The oxidation layer 163 includes a lower oxidation layer 163a disposed below the metal layer 165 and an upper oxidation layer 163b disposed above the metal layer 165, and the barrier layer 161 includes a lower barrier layer 161a disposed under the lower oxidation layer 163a and an upper barrier layer 161b disposed on the upper oxidation layer 163b.

The metal layer 165 may include at least one selected among silver (Ag) and a silver alloy, gold (Au) and a gold alloy, aluminum (Al) and an aluminum alloy, nickel (Ni) and a nickel alloy, copper (Cu) and a copper alloy, tungsten (W) and a tungsten alloy, and platinum (Pt) and a platinum alloy.

The metal layer 165 my further include a material included in a below-described oxidation layer 163.

The upper oxidation layer 163b and the lower oxidation layer 163a that are respectively formed at upper and lower surfaces of the metal layer 165 may include a material in which oxidation is more easily generated than in the metal material of the metal layer 165. For example, the oxidation layer 163 may include at least one among bismuth (Bi), indium (In), palladium (Pd), tin (Sn), zinc (Zn), and titanium (Ti).

More specifically, the material included in the oxidation layer 163 may be a material for which Gibbs free energy (AG) is smaller than the material included in the metal layer 165.

In general, oxidation may occur to a greater degree in material where Gibbs free energy is low than in material where Gibbs free energy is high. That is, a state of an oxide is more stable than a state of its pure metal when the Gibbs free energy is lower. The oxidation layer 163 may be in a state in which the above-described materials are oxidized. That is, the oxidation layer 163 may include at least one among bismuth oxide ($Bi_2O_3$), palladium oxide (PdO), tin oxide ($SnO_2$), zinc oxide (ZnO), indium oxide ($In_2O_3$), and titanium oxide ($TiO_2$).

The barrier layer 161 protects the metal layer 165 from the external environment, and may include a transparent conductive oxide. For example, it may include indium tin oxide (ITO), indium zinc oxide (IZO), tin oxide ($SnO_2$), or zinc oxide (ZnO).

In general, in the metal layer 165 according to the present exemplary embodiment, when a metal is used as the material of the electrode, metal particles may be generated when the metal material in the electrode is bunched, and then the generated metal particle is eluted or otherwise moves outside the electrode, thereby causing a short with other electrodes. When an electrode short is generated, failure of the organic light emitting element may occur, and defective pixels may be seen in an organic light emitting diode display that employs the organic light emitting element.

Accordingly, in the organic light emitting element LD according to the present exemplary embodiment, since the surface of the metal layer 165 is covered by using the oxidation layer 163, metal particles are prevented from being shed from the electrode, thereby preventing defective pixels from being generated.

A pixel definition layer 125 having an opening 138 is formed on the planarization layer 124. That is, the pixel definition layer 125 has a plurality of openings 138, one formed for each pixel. In this case, a light-emitting diode display layer 170 may be formed for each opening 138 in the pixel definition layer 125. Accordingly, a pixel area in which the light-emitting diode display layer 170 is respectively formed may be defined by the pixel definition layer 125.

In this case, the first electrode 160 is disposed to correspond to the opening 138 in the pixel definition layer 125. As shown in FIG. 1, part of the first electrode 160 may be disposed under the pixel definition layer 125 to overlap the pixel definition layer 125, however it is not limited thereto.

The pixel definition layer 125 may be made of a polyacrylic resin, a polyimide resin, or a silica series inorganic material.

A structure of the light-emitting diode display layer 170 formed on the first electrode 160 will be described in further detail below.

The second electrode 180 may be formed on the light-emitting diode display layer 170. The second electrode 180 may be a common electrode. As described above, the organic light emitting element LD may be formed to include the first electrode 160, the light-emitting diode display layer 170, and the second electrode 180.

In this case, the second electrode 180 is a transflective electrode and may be formed of a transflective conductive material. The second electrode 180 may include magnesium (Mg), calcium (Ca), aluminum (Al), silver (Ag), or alloys thereof, having a low work function. When the second electrode 180 is made of one or more alloys of magnesium (Mg) and silver (Ag), it has a transflective characteristic.

That is, light emitted from the light-emitting diode display layer 170 is emitted to the outside of the display through the second electrode 180, and because the second electrode 180 has the transflective characteristic, the light may be again partially reflected toward the first electrode 160.

Accordingly, a resonance structure may be formed between the first electrode 160 used as the reflecting electrode and the second electrode 180 used as the transflective electrode. Thus, light is amplified between the first electrode 160 and the second electrode 180 and is emitted toward the second electrode 180, thereby increasing light efficiency.

Alternatively, in an alternative exemplary embodiment in which the light emitted from the emission layer 173 is instead emitted through the first electrode 160, the materials forming the first electrode 160 and the second electrode 180 may be exchanged.

Meanwhile, an overcoat 190 covering and protecting the second electrode 180 may be formed on the second electrode 180. The overcoat 190 may be formed of an inorganic layer, an organic layer, or combinations thereof.

Also, a thin film encapsulation layer 121 is formed on the overcoat 190. The thin film encapsulation layer 121 encapsulates and protects the organic light emitting element LD and a driving circuit unit (not shown) formed on the substrate 123.

The thin film encapsulation layer 121 includes organic encapsulation layers 121a and 121c and inorganic encapsulation layers 121b and 121d that are alternately laminated one by one. FIG. 1 illustrates, as an example, the case where two encapsulation organic layers 121a and 121c and two encapsulation inorganic layers 121b and 121d are alternately laminated one by one to constitute the thin film encapsulation layer 121, but the thin film encapsulation layer is not limited thereto, and the layers may be ordered in any manner.

Next, the light-emitting diode display layer 170 included in the above-described organic light emitting element LD will be described with reference to FIG. 2.

The organic light emitting element (part X of FIG. 1) according to an exemplary embodiment of the present disclosure includes the first electrode 160, the hole injection layer 171, the hole transporting layer 172, the emission layer 173, the electron transporting layer 174, the electron injection layer 175, and the second electrode 180.

Here, the light-emitting diode display layer 170 includes the hole injection layer 171, the hole transporting layer 172, the emission layer 173, the electron transporting layer 174, and the electron injection layer 175.

The first electrode 160 and the second electrode 180 are the same as described above, and any redundant description is thus omitted here.

The hole injection layer 171 may be disposed on the first electrode 160. In this case, the hole injection layer 171 may serve to improve injection of holes into the hole transporting layer 172 from the first electrode 160.

The hole injection layer 171 may be formed of copper phthalocyanine (CuPc), poly(3,4-ethylenedioxythiophene) (PEDOT), polyaniline (PANI), or N,N'-diphenyl-N,N'-di-[4-(N,N-diphenyl-amino)phenyl]benzidine (NPNPB), but is not limited thereto.

The hole transporting layer 172 may be disposed on the hole injection layer 171. The hole transporting layer 172 may serve to transport holes transmitted from the hole injection layer 171. For example, the hole transporting layer 172 may include NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4"-tris-(N-3-methylphenyl-N-phenyl-amino)-triphenylamine), TCTA (4-(9H-carbazol-9-yl)-N,N-bis[4-(9H-carbazol-9-yl)phenyl]-benzenamine), or CBP (4,4'-N,N'-dicarbazole-biphenyl), but it is not limited thereto.

In the present exemplary embodiment, the hole injection layer 171 and the hole transporting layer 172 are formed as separate layers, however they are not limited thereto, and the hole injection layer 171 and the hole transporting layer 172 may instead be formed of a single layer.

The emission layer 173 is formed on the hole transporting layer 172. The emission layer 173 includes an emission material that represents a specific color. For example, the emission layer 173 may display a basic or primary color such as blue, green, or red, or any combination thereof.

The emission layer 173 includes a host and a dopant. The emission layer 173 may include a material that emits red light, green light, blue light, and white light, and may be formed using a phosphorescent or fluorescent material.

Meanwhile, the electron transporting layer 174 may be disposed on the emission layer 173. In this case, the electron transporting layer 174 may transmit electrons from the second electrode 180 to the emission layer 173. Also, the electron transporting layer 174 prevents holes injected from the first electrode 160 from being moved to the second electrode 180 through the emission layer 173. That is, the electron transport layer 174 helps holes and electrons bond in the emission layer 173 by also functioning as a hole blocking layer.

In this case, the electron transporting layer 174 may be made of at least one selected from a group including Alq3 (tris(8-hydroxyquinolino)aluminum), PBD (2-biphenyl-4-yl-5-(4-t-butylphenyl)-1,3,4-oxadiazole), TAZ (1,2,4-triazole), spiro-PBD(spiro-2-biphenyl-4-yl-5-(4-t-butylphenyl)-1,3,4-oxadiazole), BAlq (bis(2-methyl-8-quinolinolato)-(p-phenylphenolato)aluminum(III)), and SAlq (aluminum(III) bis(2-methyl-8-quinolinolato)triphenylsilanolate), however it is not limited thereto.

The electron injection layer 175 is formed on the electron transporting layer 174. The electron injection layer 175 may serve to improve injection of electrons into the electron transporting layer 174 from the second electrode 180.

The electron injection layer 175 may include at least one selected from among $Alq_3$ (tris(8-hydroxyquinolino)aluminum), PBD, TAZ, spiro-PBD, BAlq, and SAlq, however it is not limited thereto.

Hereinafter, a manufacturing process of an organic light emitting element according to an exemplary embodiment of the present disclosure will be described with reference to FIG. 3 and FIG. 4.

Figure 3:
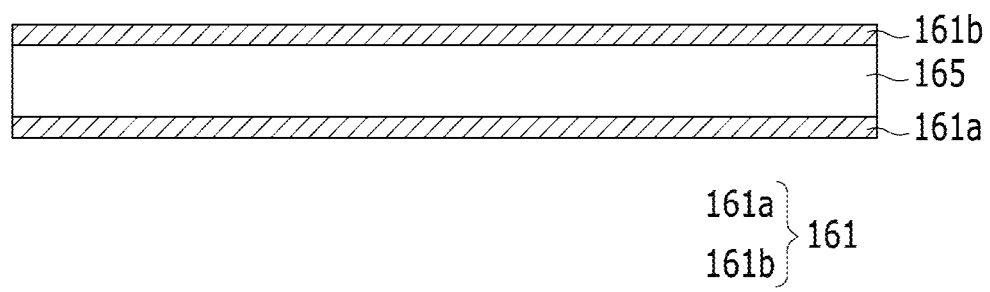
FIG. 3 and FIG. 4 are cross-sectional views sequentially showing a manufacturing process of an organic light emitting element according to an exemplary embodiment of the present disclosure.
Figure 4:
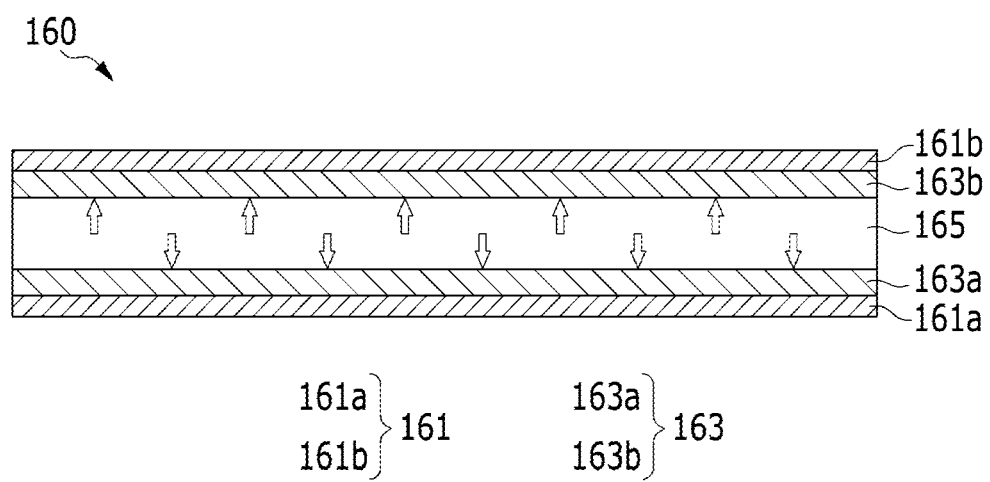

FIG. 3 and FIG. 4 are cross-sectional views sequentially showing a manufacturing process of an organic light emitting element according to an exemplary embodiment of the present disclosure.

First, referring to FIG. 3, a barrier layer 161 covering lower and upper surfaces of the metal layer 165 is formed.

The metal layer 165 may include a first material of at least one among silver (Ag), gold (Au), aluminum (Al), nickel (Ni), copper (Cu), tungsten (W), platinum (Pt), and alloys thereof, and a second material that is more easily oxidized than the first material.

As the second material, for example, at least one selected from bismuth (Bi), indium (In), palladium (Pd), tin (Sn), zinc (Zn), and titanium (Ti) may be included.

The second material may be present in a range of 0.1-3.0 wt % for a total weight of the metal layer 165. More specifically, when a content of the second material is over 3.0 wt %, the reflectance of the metal layer 165 to be formed as the reflecting electrode may be deteriorated, while when the content of the second material is less than 0.1 wt %, an oxidation layer may not be uniformly formed in a process step described later with respect to FIG. 4.

The barrier layer 161 protects the metal layer 165 from the external environment, and may include a transparent conductive oxide, for example, indium tin oxide (ITO), indium zinc oxide (IZO), tin oxide ($SnO_2$), or zinc oxide (ZnO).

Next, referring to FIG. 4, the transparent conductive oxide forming the barrier layer 161 is crystallized through a heat treatment of the metal layer 165 and the barrier layer 161, and an oxidation layer 163 covering the lower and upper surfaces of the metal layer 165 is simultaneously formed, thereby completing a first electrode 160.

The heat treatment may be performed in a temperature of 150-350° C.

During heat treatment, while the second material included inside the metal layer 165 is oxidized, voluntary diffusion may be generated to the surface of the metal layer 165, and as diffusion of the second material to the surface of the metal layer 165 is generated, the oxide of the second material may be included, and a lower oxidation layer 163a and an upper oxidation layer 163b may thus be formed.

The oxidation layer 163 may include at least one selected from bismuth oxide ($Bi_2O_3$), palladium oxide (PdO), tin oxide ($SnO_2$), zinc oxide (ZnO), indium oxide ($In_2O_3$), and titanium oxide ($TiO_2$) as the oxide state of the above-described second material.

An oxygen atom included in the oxidation layer 163 according to the present exemplary embodiment may be supplied from the transparent conductive oxide of the barrier layer 161.

Next, a hole injection layer 171, a hole transporting layer 172, an emission layer 173, an electron transporting layer 174, an electron injection layer 175, and a second electrode 180 are formed on the first electrode 160, thereby completing the organic light emitting element shown in FIG. 2.

Next, an experimental example illustrating the structure and performance of an electrode according to the present exemplary embodiment will be described with reference to FIG. 5 to FIG. 10.

To confirm the structure and performance of the electrode according to the present exemplary embodiment, ITO is used as the barrier layer, a silver alloy (Ag alloy) is used as the metal layer, and zinc (Zn) is used for the oxidation layer.

A structure of ITO (7 nm)/silver alloy (100 nm)/ITO (7 nm) is deposited, where zinc at 1.0 wt % for the total weight of the silver alloy is added to the silver alloy.

Next, heat treatment is performed on the deposition structure at 250° C., to manufacture the electrode according to the present exemplary embodiment.

Also, as a comparative example, another electrode is fabricated, having an ITO (7 nm)/silver alloy (100 nm)/ITO (7 nm) structure, but without an oxidation layer. That is, the silver alloy used in the comparative example does not contain any material that is more easily oxidized than silver.

Figure 5A:
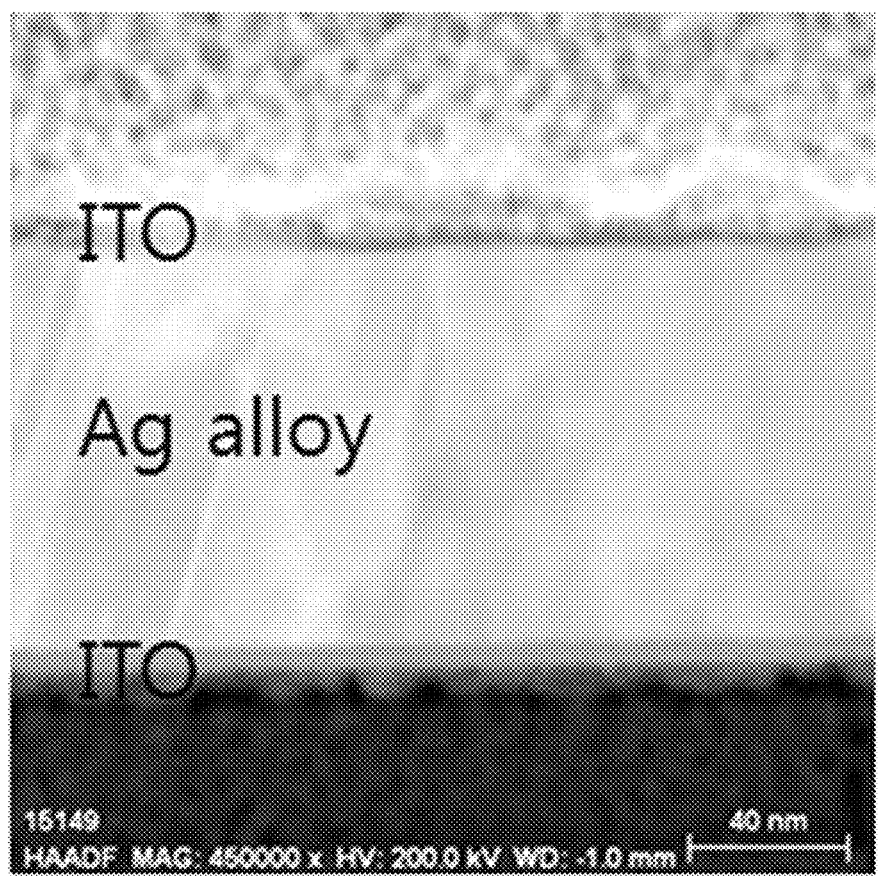
FIG. 5A, FIG. 5B, and FIG. 5C are photos of a cross-section of an electrode of an organic light emitting element according to an exemplary embodiment of the present disclosure.
Figure 5B:
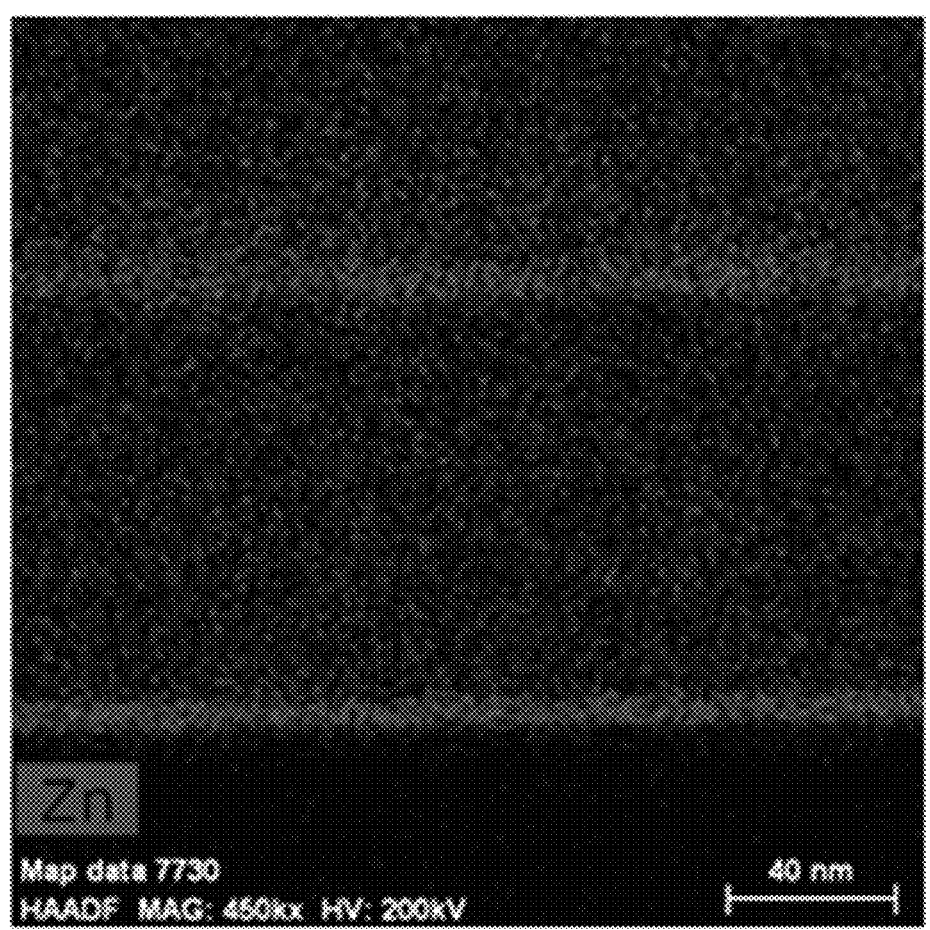
Figure 5C:
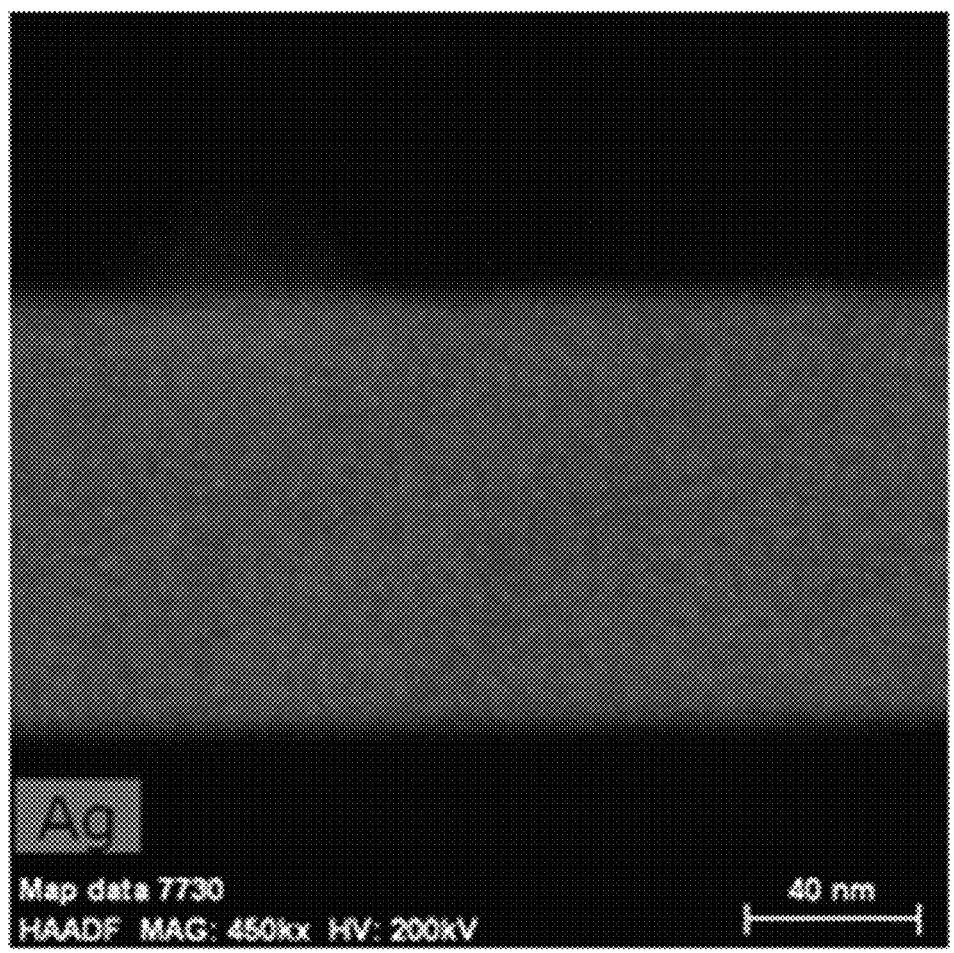

First, photos of the electrode according to the present exemplary embodiment taken through TEM-EDS (transmission electron microscope-X Ray spectroscopy) are shown in FIG. 5A to FIG. 5C.

FIG. 5A is a TEM photo of a cross-section of the electrode of the organic light emitting element according to an exemplary embodiment of the present disclosure, and FIG. 5B and FIG. 5C are EDS photos.

Particularly, FIG. 5B is a photo of a distribution of zinc (Zn) in the electrode of the organic light emitting element, and FIG. 5C is a photo of the distribution of silver (Ag).

As shown in FIG. 5B and FIG. 5C, it may be confirmed that zinc is concentrated at the upper and lower surfaces of the silver alloy layer, such that the zinc oxidation layer (ZnO) is formed.

An experiment was then performed to confirm whether an electrode with an oxidation layer according to the present exemplary embodiment prevents emission of metal particles.

Figure 6:
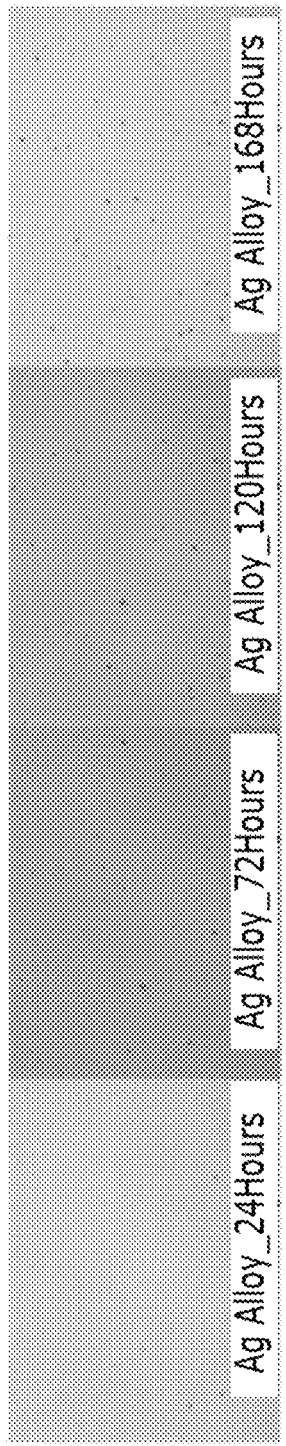
FIG. 6 shows photos of an electrode of an organic light emitting element over time as a comparative example of the present disclosure.
Figure 7:
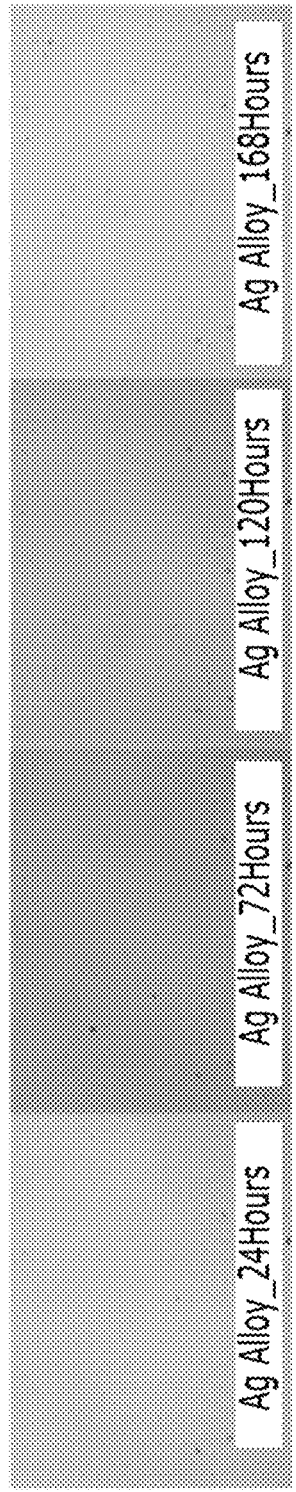
FIG. 7 shows photos of an electrode of an organic light emitting element over time as an exemplary embodiment of the present disclosure.

The electrode according to the present exemplary embodiment, and the electrode according to the comparative example, were respectively put in a high temperature and high humidity environment (at a temperature of 85° C. and humidity of 85%), which is an environment in which metal particles may be readily shed, and photos of the electrode surfaces over time are shown in FIG. 6 and FIG. 7.

FIG. 6 shows photos of particles emitted by an electrode of the comparative example, and FIG. 7 shows photos of particles emitted by an electrode of an exemplary embodiment of the present disclosure.

When comparing an electrode fabricated according to the comparative example as shown in FIG. 6, to an electrode fabricated according to the exemplary embodiment as shown in FIG. 7, the metal particles, shown as small black points, are much less prevalent in FIG. 7 than in FIG. 6. Thus, embodiments of the present disclosure may prevent or reduce the number of metal particles generated by an electrode.

Figure 8:
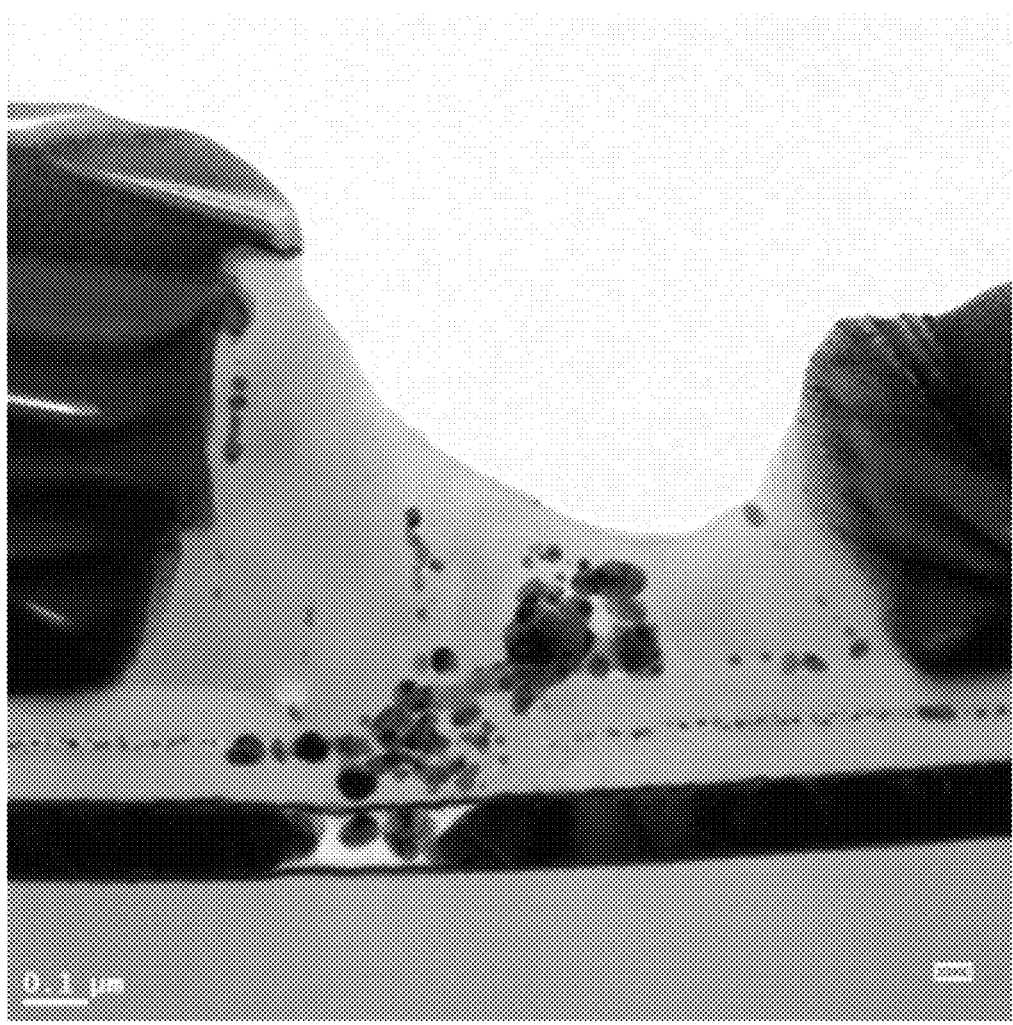
FIG. 8 is a photo of a cross-section of an electrode of an organic light emitting element as a comparative example of the present disclosure.
Figure 9:
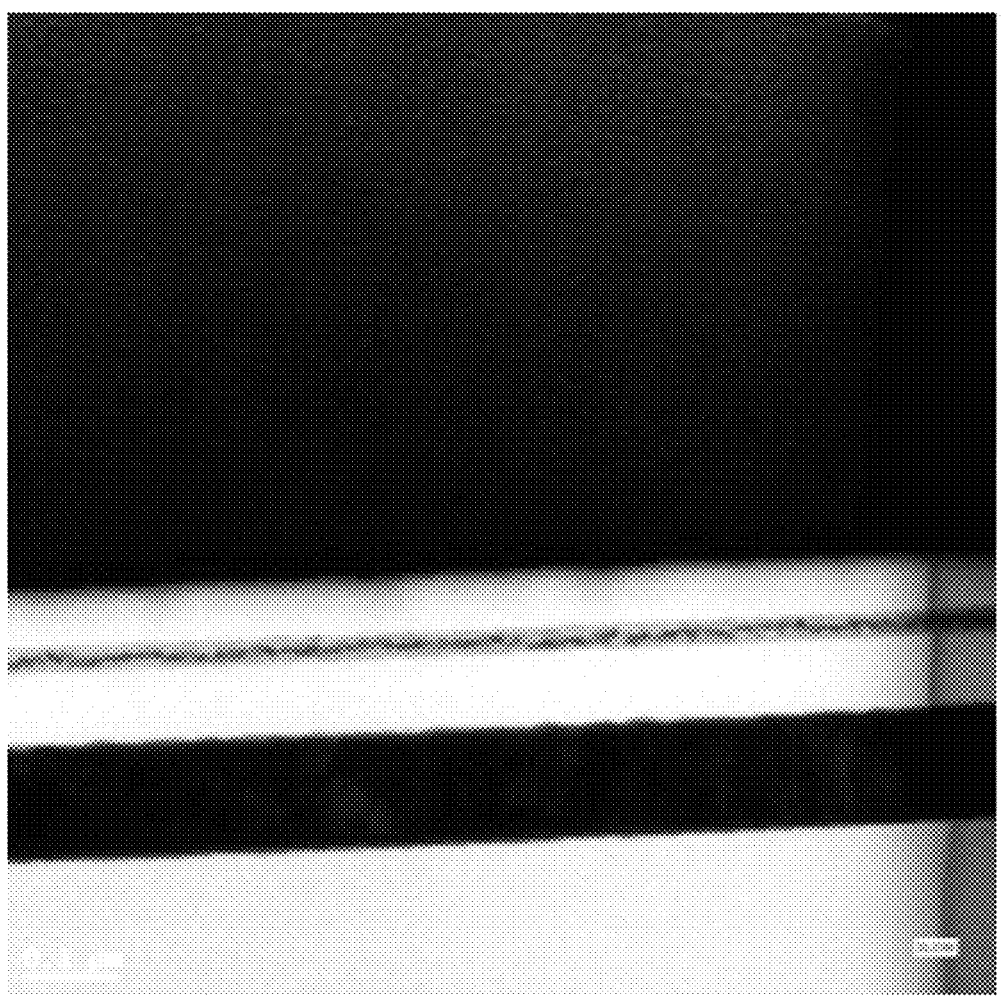
FIG. 9 is a photo of a cross-section of an electrode of an organic light emitting element as an exemplary embodiment of the present disclosure.

Also, the cross-sections found by cutting the electrodes according to the comparative example and the exemplary embodiment are photographed by TEM, and the photos are shown in FIG. 8 and FIG. 9.

FIG. 8 is a photo of a cross-section of an electrode of an organic light emitting element constructed according to the above-described comparative example, and FIG. 9 is a photo of a cross-section of an electrode of an organic light emitting element constructed according to an exemplary embodiment of the present disclosure.

As shown in FIG. 8, in the electrode according to the comparative example, it may be confirmed that metal particles are generated such that an empty space represented by a white color is generated in the metal layer. In contrast, in the electrode according to the exemplary embodiment, it may be seen that metal particles are not generated, so that the metal layer is formed in a more uniform state.

Figure 10:
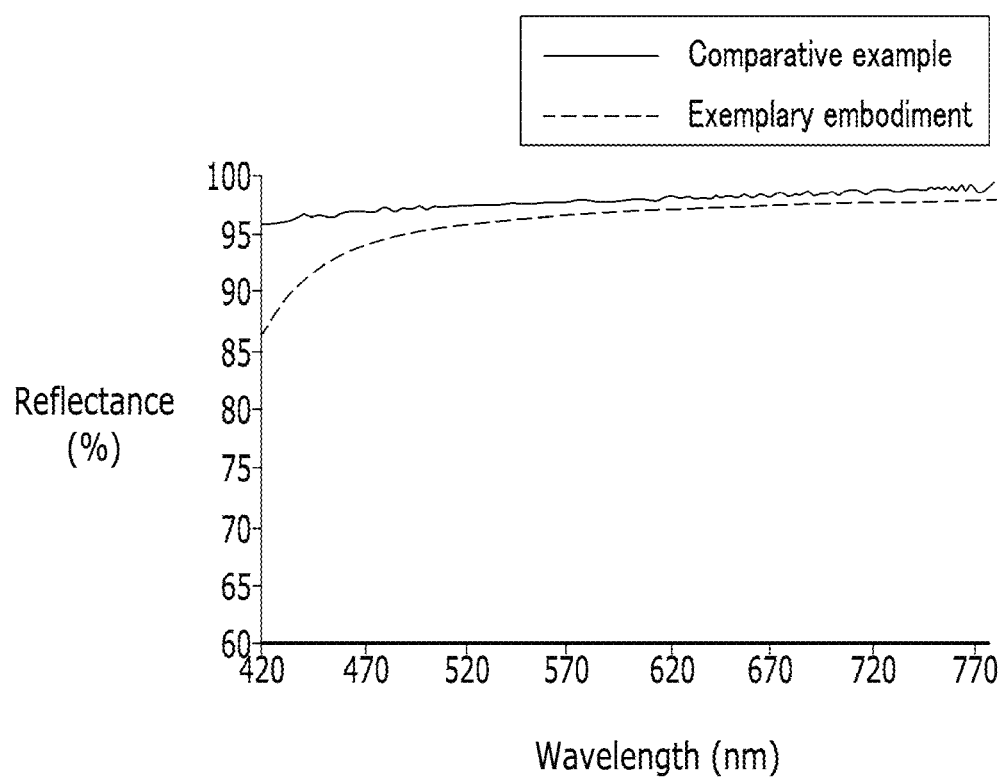
FIG. 10 is a graph showing measurements of visible ray reflectance of an electrode of an organic light emitting element according to a comparative example and an exemplary embodiment of the present disclosure.

Next, reflectance of the electrodes according to the exemplary embodiment and the comparative example is measured to determine a reflection characteristic of the electrode according to the present exemplary embodiment, with results shown in FIG. 10.

FIG. 10 is a graph showing measurements of visible ray reflectance of an electrode of an organic light emitting element according to a comparative example and an exemplary embodiment of the present disclosure.

The horizontal axis of FIG. 10 represents a wavelength (nm) of visible light, and the vertical axis represents reflectance (%) of the light.

As shown in FIG. 10, in a case of the electrode according to the present exemplary embodiment, compared with the electrode according to the comparative example, reflectance is only poorer in a blue wavelength region (420-500 nm), but is comparable for other light wavelengths. Accordingly, electrodes constructed according to the present disclosure may suffice for use as the reflecting electrode of an organic light emitting element.

As described above, according to an exemplary embodiment of the present disclosure, defective pixel generation due to electrode formation failure may be prevented through an oxidation layer formed in the electrode surface of the organic light emitting element.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can thus be mixed and matched in any manner, to produce further embodiments consistent with the invention.

Description of Symbols

123: substrate
130: thin film transistor
160: first electrode
180: second electrode
171: hole injection layer
172: hole transporting layer
173: emission layer
174: electron transporting layer
175: electron injection layer
161: barrier layer
163: oxidation layer
165: metal layer

What is claimed is:

1. An organic light emitting element comprising:
a first electrode;
a second electrode overlapping the first electrode; and
an emission layer disposed between the first electrode and the second electrode,
wherein at least one of the first electrode and the second electrode includes:
a metal layer including a first material,
an oxidation layer including a second material and disposed on two opposing surfaces of and directly contacting the metal layer, and
a barrier layer disposed at a surface of the oxidation layer,
wherein the second material has a smaller Gibbs free energy than that of the first material, and
wherein the metal layer further includes the second material in a range of 0.1-3.0 wt % for a total weight of the metal layer.

2. The organic light emitting element of claim 1, wherein the first material includes at least one of silver (Ag) and a silver alloy, gold (Au) and a gold alloy, aluminum (Al) and an aluminum alloy, nickel (Ni) and a nickel alloy, copper (Cu) and a copper alloy, tungsten (W) and a tungsten alloy, and platinum (Pt) and a platinum alloy.

3. The organic light emitting element of claim 2, wherein the second material includes an oxide of at least one of bismuth (Bi), indium (In), palladium (Pd), tin (Sn), zinc (Zn), and titanium (Ti).

4. The organic light emitting element of claim 3, wherein the oxide includes at least one of bismuth oxide ($Bi_2O_3$), palladium oxide (PdO), tin oxide ($SnO_2$), zinc oxide (ZnO), indium oxide ($In_2O_3$), and titanium oxide ($TiO_2$).

5. The organic light emitting element of claim 3, wherein the barrier layer includes a transparent conductive oxide.

6. The organic light emitting element of claim 5, wherein the transparent conductive oxide includes at least one of indium tin oxide (ITO), indium zinc oxide (IZO), tin oxide ($SnO_2$), and zinc oxide (ZnO).

7. The organic light emitting element of claim 1, wherein the second electrode includes a transflective conductive material, and
the second electrode includes at least one of magnesium (Mg), potassium K, aluminum (Al), silver (Ag), and an alloy thereof.

8. The organic light emitting element of claim 1, wherein the metal layer is continuously formed and does not directly contact the barrier layer, and
wherein the oxidation layer directly contacts the metal layer on each of the two opposing surfaces.

9. The organic light emitting element of claim 1, wherein both the portion of the oxidation layer disposed on one of the two opposing surfaces and the portion of the oxidation layer disposed on the other of the two opposing surfaces include the second material.

10. A method of manufacturing an organic light emitting element, the method comprising:
forming a barrier layer on at least one surface of a metal layer, the metal layer including a first material and a second material;
heat-treating the barrier layer and the metal layer to form an oxidation layer on two opposing surfaces of the metal layer, thereby forming a first electrode;
forming an emission layer on the first electrode; and
forming a second electrode on the emission layer,
wherein the oxidation layer includes an oxide of the second material, and
wherein the second material has a smaller Gibbs free energy than that of the first material.

11. The method of claim 10, wherein
the first material includes at least one of silver (Ag) and a silver alloy, gold (Au) and a gold alloy, aluminum (Al) and an aluminum alloy, nickel (Ni) and a nickel alloy, copper (Cu) and a copper alloy, tungsten(W) and a tungsten alloy, and platinum (Pt) and a platinum alloy.

12. The method of claim 11, wherein
the second material includes at least one of bismuth (Bi), indium (In), palladium (Pd), tin (Sn), zinc (Zn), and titanium (Ti).

13. The method of claim 12, wherein
the barrier layer includes a transparent conductive oxide.

14. The method of claim 10, wherein
the second material is included in a range of 0.1-3.0 wt % with respect to a total weight of the metal layer.

15. The method of claim 10, wherein
the heat-treating further comprises heat-treating the barrier layer and the metal layer at 150-350° C.

16. An organic light emitting diode display comprising:
a substrate;
a thin film transistor disposed on the substrate;
a first electrode connected to the thin film transistor;
a second electrode overlapping the first electrode; and
an emission layer disposed between the first electrode and the second electrode,
wherein the first electrode includes:
a metal layer including a first material,
an oxidation layer including a second material and disposed on two opposing surfaces of and directly contacting the metal layer, and
a barrier layer disposed at the surface of the oxidation layer,
wherein the second material has a smaller Gibbs free energy than that of the first material, and
wherein the metal layer further includes the second material in a range of 0.1-3.0 wt % for a total weight of the metal layer.

17. The organic light emitting diode display of claim 16, wherein
the first material includes at least one of silver (Ag) and a silver alloy, gold (Au) and a gold alloy, aluminum (Al) and an aluminum alloy, nickel (Ni) and a nickel alloy, copper (Cu) and a copper alloy, tungsten(W) and a tungsten alloy, and platinum (Pt) and a platinum alloy, and
the second material includes at least one of an oxide of bismuth (Bi), indium (In), palladium (Pd), tin (Sn), zinc (Zn), and titanium (Ti).

18. The organic light emitting diode display of claim 17, wherein
the barrier layer includes a transparent conductive oxide.

19. The organic light emitting diode display of claim 17, wherein
the metal layer further includes the second material.

* * * * *